(12) United States Patent
Masuko et al.

(10) Patent No.: US 10,475,946 B2
(45) Date of Patent: Nov. 12, 2019

(54) METHOD OF MANUFACTURING BACK SURFACE JUNCTION TYPE SOLAR CELL (71) Applicant: Panasonic Intellectual Property Management Co., Ltd., Osaka (JP)

(72) Inventors: Keiichiro Masuko, Osaka (JP); Yasufumi Tsunomura, Osaka (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 0 days.

(21) Appl. No.: 16/385,724

(22) Filed: Apr. 16, 2019

(65) Prior Publication Data

US 2019/0245108 A1 Aug. 8, 2019

Related U.S. Application Data

(63) Continuation of application No. 15/938,864, filed on Mar. 28, 2018, now Pat. No. 10,312,396, which is a continuation of application No. PCT/JP2016/003838, filed on Aug. 23, 2016.

(30) Foreign Application Priority Data

Sep. 30, 2015 (JP) ................................. 2015-193233

(51) Int. Cl.
*H01L 31/068* (2012.01)
*H01L 31/0224* (2006.01)
*H01L 31/18* (2006.01)
*H01L 31/0747* (2012.01)

(52) U.S. Cl.
CPC ...... *H01L 31/0682* (2013.01); *H01L 31/0224* (2013.01); *H01L 31/022441* (2013.01); *H01L 31/0747* (2013.01); *H01L 31/18* (2013.01); *H01L 31/1804* (2013.01); *Y02E 10/50* (2013.01); *Y02P 70/521* (2015.11)

(58) Field of Classification Search
CPC ............. H01L 31/0682; H01L 31/0224; H01L 31/022441; H01L 31/0747; H01L 31/18; H01L 31/1804
See application file for complete search history.

(56) References Cited

U.S. PATENT DOCUMENTS

2012/0037227 A1   2/2012  Takahama et al.
2013/0137211 A1*  5/2013  Mishima ........... H01L 31/02167
                                                        438/98
2015/0027532 A1*  1/2015  Yamaguchi ......... H01L 31/0682
                                                        136/256

FOREIGN PATENT DOCUMENTS

WO        2010/104098 A1    9/2010

OTHER PUBLICATIONS

Notice of Allowance issued in parent U.S. Appl. No. 15/938,864, dated Jan. 17, 2019.

* cited by examiner

*Primary Examiner* — Jayne L Mershon
(74) *Attorney, Agent, or Firm* — McDermott Will & Emery LLP (57) ABSTRACT

A method of manufacturing a solar cell includes: forming a conductive thin film layer on a semiconductor substrate; forming an insulating film on the conductive thin film layer; forming a conductive thin film layer exposed portion by removing a part of the insulating film; forming a plating film in the conductive thin film layer exposed portion; and removing the insulating film and the conductive thin film layer in an area not overlapping the plating film, wherein the plating film formed in the forming of a plating film is formed to cover the insulating film.

8 Claims, 6 Drawing Sheets

METHOD OF MANUFACTURING BACK SURFACE JUNCTION TYPE SOLAR CELL

CROSS-REFERENCE TO RELATED APPLICATION

This is a Continuation of U.S. patent application Ser. No. 15/938,864, filed Mar. 28, 2018, which is a Continuation of International Application No. PCT/JP2016/003838, filed Aug. 23, 2016, which claims the benefit of Japanese Patent Application No. 2015-193233, filed on Sep. 30, 2015, the entire contents of each are hereby incorporated by reference.

BACKGROUND

1. Field

The disclosure relates to a method of manufacturing a solar cell and particularly to a method of manufacturing a back surface junction type solar cell.

2. Description

Solar cells having high power generation efficiency include back surface junction type solar cells with an n-type semiconductor layer and a p-type semiconductor layer formed on a back surface thereof, which is opposite to a light-receiving surface on which light becomes incident. The n-type electrode formed on the n-type semiconductor layer and the p-type electrode formed on the p-type semiconductor layer need be insulated so that they do not come into contact with each other. For insulation, the n-type semiconductor layer and the p-type semiconductor layer, which are joined temporarily in a solar cell manufacturing step, need be isolated by laser irradiation or lithography using a photomask.

[patent document 1] WO2010/104098

The related art method of isolating the n-side electrode and the p-side electrode using, for example, a photoresist has a benefit of a small isolation width. On the other hand, the related-art method has a problem in that the cost of a resist material and a resist stripping material is high. The n-side electrode and the p-side electrode may be isolated by screen-printing an etching paste. However, the printing precision is not sufficient and the isolation width cannot be sufficiently small. Laser isolation of the n-side electrode and the p-side electrode has a limitation in that a channel narrower than the width of laser irradiation cannot be formed.

SUMMARY

In this background, a purpose of the present invention is to provide solar cells in which the manufacturing cost is reduced and the photoelectric conversion efficiency is improved.

A method of manufacturing a solar cell includes: forming a conductive thin film layer on a semiconductor substrate; forming an insulating film on the conductive thin film layer; forming a conductive thin film layer exposed portion by removing a part of the insulating film; forming a plating film in the conductive thin film layer exposed portion; and removing the insulating film and the conductive thin film layer in an area not overlapping the plating film, wherein the plating film formed in the forming of a plating film is formed to cover the insulating film.

BRIEF DESCRIPTION OF THE DRAWINGS

The figures depict one or more implementations in accordance with the present teaching, by way of example only, not by way of limitations. In the figures, like reference numerals refer to the same or similar elements.

DETAILED DESCRIPTION

The invention will now be described by reference to the preferred embodiments. This does not intend to limit the scope of the present invention, but to exemplify the invention.

A description will be given of an embodiment with reference to the drawings. In the explanations of the figures, the same elements shall be denoted by the same reference numerals, and duplicative explanations will be omitted appropriately. The drawings are schematic and it should be noted that the dimensional ratio is different from the actual ratio. Accordingly, the precise dimensions should be determined in light of the following description. It should of course be noted that the drawings include portions mutually different from one drawing to another in terms of the relative dimensions and proportions. A description will first be given of the structure of a solar cell formed according to the embodiment and a description will then be given of a method of manufacturing the solar cell.

(Structure of Solar Cell)

Figure 1:
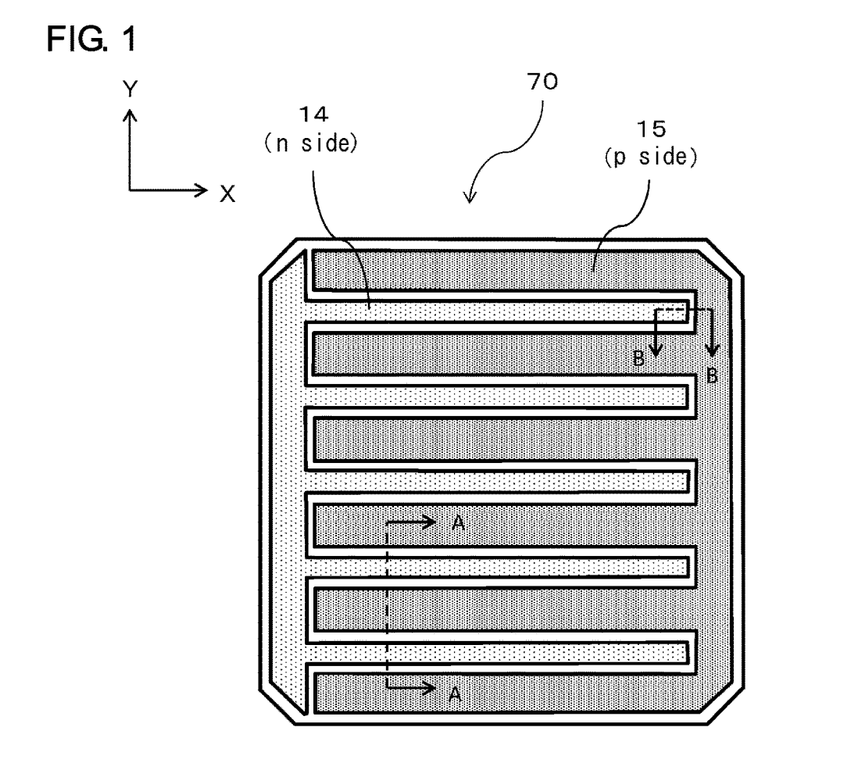
FIG. 1 is a plan view illustrating a solar cell according to an embodiment.

FIG. 1 is a plan view illustrating a solar cell 70 according to an embodiment and shows the structure of the back surface of the solar cell 70. The embodiment relates to a back surface junction type solar cell provided with electrodes only on the back surface of the cell so as that the light entering the light receiving surface is not blocked at all and is caused to contribute to power generation. The light-receiving surface means a principal surface on which light (sunlight) mainly becomes incident in the solar cell 70 and, specifically, means a surface on which the major portion of light entering the solar cell 70 becomes incident. On the other hand, the back surface means the other principal surface opposite to the light-receiving surface.

The solar cell 70 includes an n-side electrode 14 and a p-side electrode 15 provided on the back surface. The n-side electrode 14 is formed in a comb-tooth shape including a bus bar electrode extending in the y direction and a plurality of finger electrodes extending in the x direction. Similarly, the p-side electrode 15 is also formed in a comb-tooth shape including a bus bar electrode extending in the y direction and a plurality of finger electrodes extending in the x direction. The n-side electrode 14 and the p-side electrode 15 are formed such that the comb teeth of the electrodes are engaged with each other and inserted into each another. Each of the n-side electrode 14 and the p-side electrode 15 may be a busbar-less electrode consisting only of a plurality of fingers and having no busbars.

Figure 10:
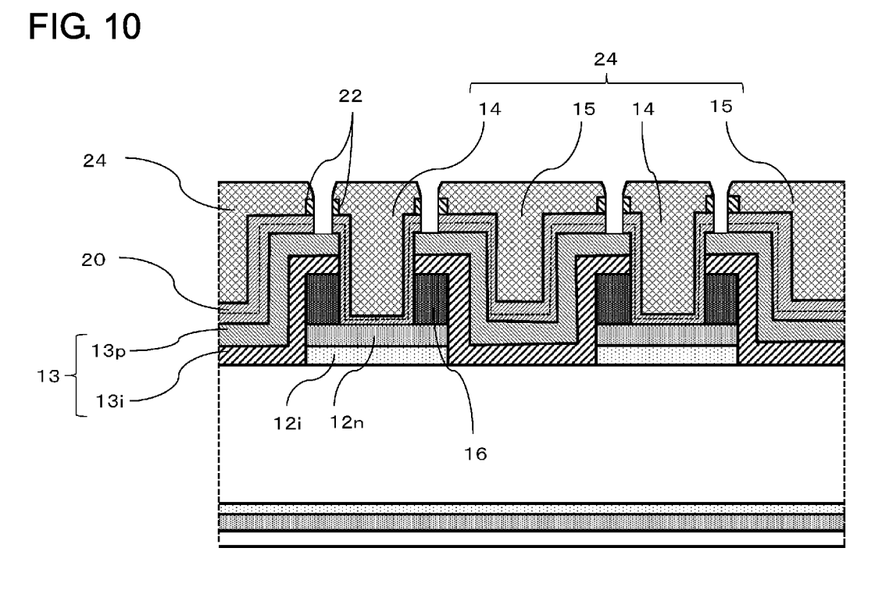
FIG. 10 is a schematic cross sectional view showing a method of manufacturing an electrode portion of the solar cell according to the embodiment.
Figure 11:
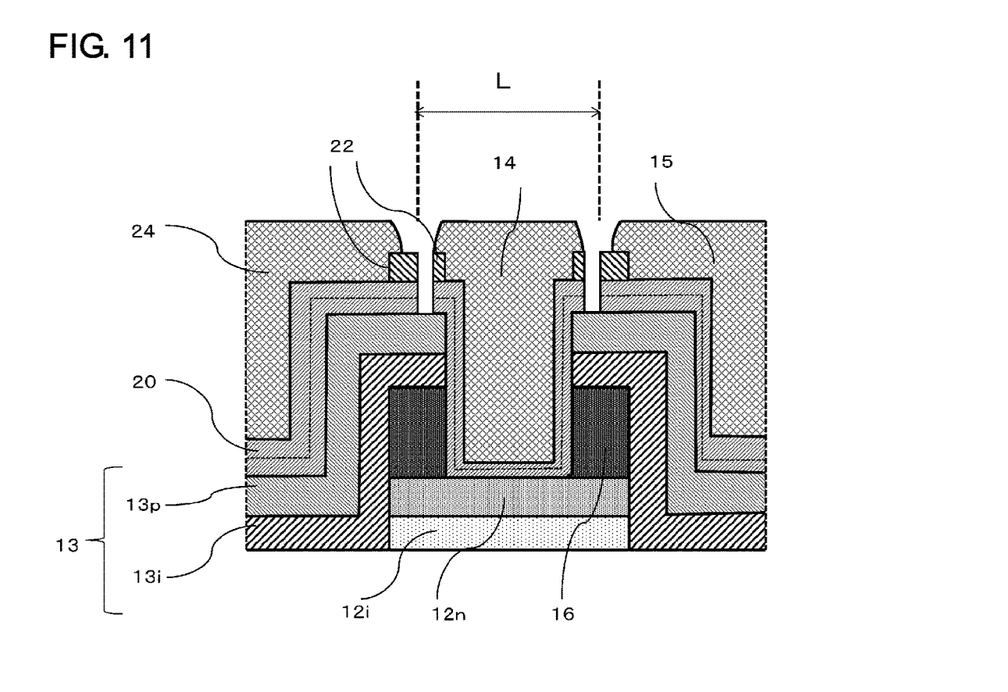
FIG. 11 is a schematic cross sectional view showing a method of manufacturing an electrode portion of the solar cell according to the embodiment.

FIG. 10 is a cross sectional view of the structure of the solar cell 70 according to the embodiment and shows an AA cross section of FIG. 1. The solar cell 70 includes a semiconductor substrate 10, a first i-type layer 12$i$, a first conductivity type layer 12$n$, a second i-type layer 13$i$, a second conductivity type layer 13$p$, a third i-type layer 17$i$, a first conductivity type layer 17$n$, a second insulating layer 18, and a copper electrode 24. The copper electrode 24 includes the n-side electrode 14 and the p-side electrode 15. FIG. 11 is a B-B cross section of the solar cell 70 according to the embodiment.

(Method of Manufacturing the Solar Cell 70)

A description will now be given of a method of manufacturing the solar cell 70 according to the embodiment. A description will now be given of formation of a photoelectric conversion part of the solar cell 70 with reference to FIGS. 2-5. A description will then be given of a method of forming electrodes for retrieving photoelectric carriers generated in the photoelectric conversion part with reference to FIGS. 6-10. The manufacturing method will be described particularly with reference to a cross sectional view representing the A-A cross section of FIG. 1.

(Method of Manufacturing Photoelectric Conversion Part)

First, the semiconductor substrate 10 is prepared. In this embodiment, the semiconductor substrate 10 made of n-type monocrystalline silicon having a thickness of about 200 μm is used, but the type of material is not particularly limited. The conductivity type may be n-type or p-type, and either a monocrystalline semiconductor substrate or a polycrystalline semiconductor substrate may be used. The thickness of the semiconductor substrate 10 is also arbitrary.

Figure 2:
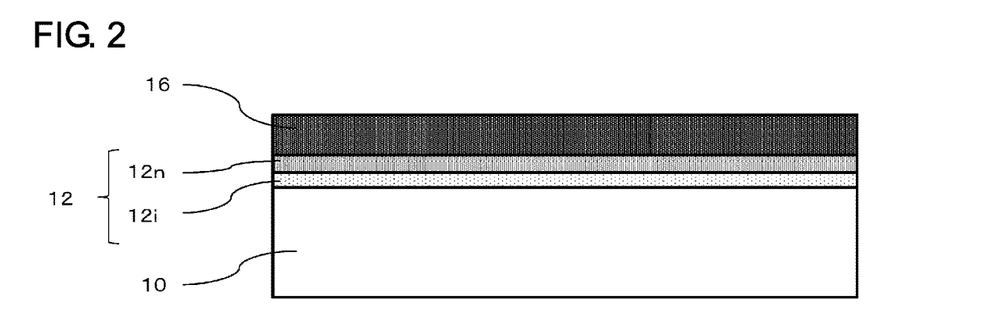
FIG. 2 is a schematic cross sectional view showing a method of manufacturing a photoelectric conversion part according to the embodiment.

Subsequently, semiconductor layers are built on the back surface of the semiconductor substrate 10, as shown in FIG. 2. In this embodiment, a first stack 12 comprised of a first i-type layer 12$i$ and a first conductivity type layer 12$n$ is formed. The first i-type layer 12$i$ is made of an i-type amorphous silicon containing hydrogen (H) and has a thickness of, for example, about several nm~25 nm. The method of forming the first i-type layer 12$i$ is not particularly limited. For example, the layer can be formed by a chemical vapor deposition (CVD) method such as a plasma CVD method. The first conductivity type layer 12$n$ is formed of an amorphous semiconductor doped with a dopant of the same conductivity as that of the semiconductor substrate 10. The first conductivity type layer 12$n$ of the embodiment is formed of an n-type amorphous silicon containing hydrogen.

The first conductivity type layer 12$n$ has a thickness of, for example, about 2 nm~50 nm. A first insulating layer 16 is built on the first stack 12. The first insulating layer 16 is formed of, for example, silicon oxide ($SiO_2$), silicon nitride (SiN), silicon oxynitride (SiON), or the like. The first insulating layer 16 is desirably formed of silicon nitride and preferably contains hydrogen.

Figure 3:
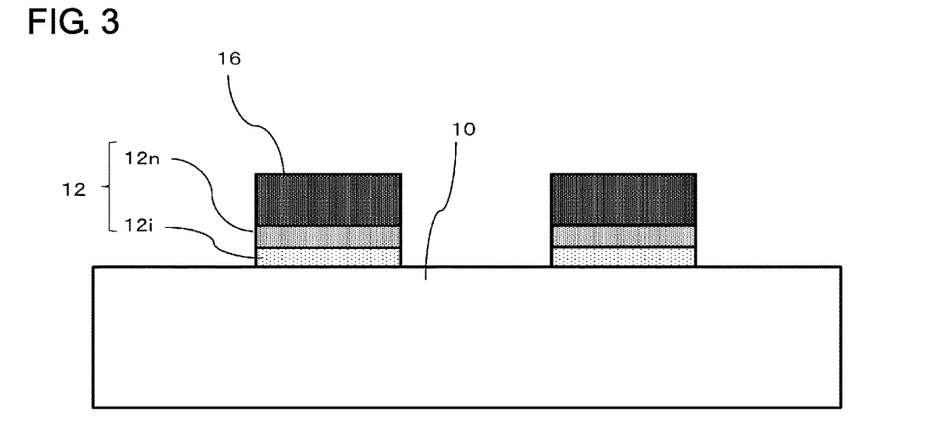
FIG. 3 is a schematic cross sectional view showing a method of manufacturing a photoelectric conversion part according to the embodiment.

Subsequently, the first insulating layer 16 and the first stack 12 are patterned, as shown in FIG. 3. In this embodiment, patterning is performed such that an insulating layer having a width of about 500 μm remains. In this embodiment, the first insulating layer 16 formed of silicon nitride (SiN) is patterned by laser irradiation, and the first stack 12 formed of an amorphous semiconductor layer is patterned by using a chemical etching method. Laser patterning of the first insulating layer 16 is performed as described below. Desirably, short-pulse laser having a pulse width on the order of nanoseconds (ns) or picoseconds (ps) is used in order to modify the thermal impact on a portion irradiated by laser. YAG laser or eximer laser can be used as such laser 50. In this embodiment, the third harmonic (wavelength: 355 nm) of Nd:YAG laser (wavelength: 1064 nm) is used as a laser light source and the target is irradiated with an intensity of about 0.1~0.5 J/cm2 per one pulse. It is desired that a laser light source having a high repetition frequency be used so that a pattern can be formed by laser in a short period of time.

The first stack 12 may be patterned by chemical etching as described below. The first insulating layer 16 patterned by laser as described above is used as a mask to etch the first stack 12. Provided that the first insulating layer 16 is formed of silicon oxide, silicon nitride, or silicon oxynitride, the first stack 12 may be etched by using an alkali etchant.

Figure 4:
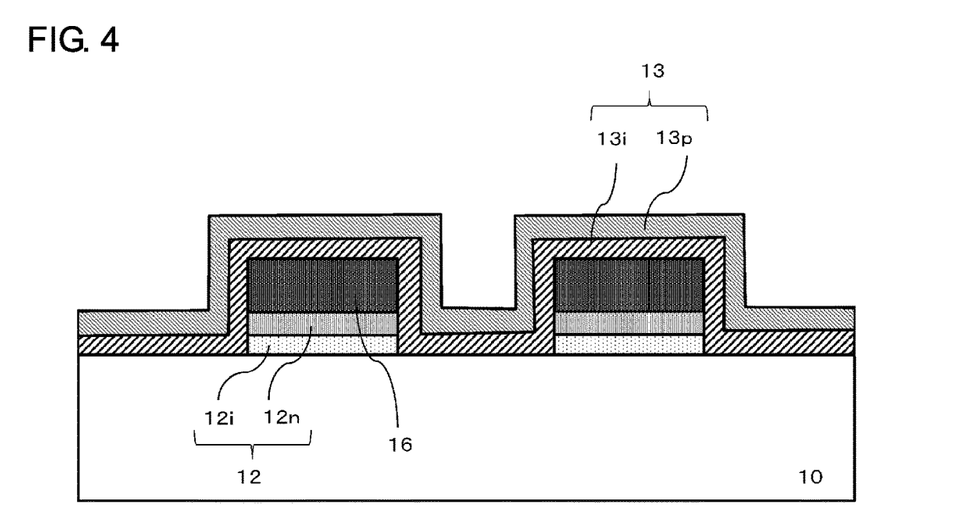
FIG. 4 is a schematic cross sectional view showing a method of manufacturing a photoelectric conversion part according to the embodiment.

Subsequently, as shown in FIG. 4, a second stack 13 comprised of a second i-type layer 13$i$ and a second conductivity type layer 13$p$ is formed on the first stack 12 and the first insulating layer 16 patterned. The second i-type layer 13$i$ is made of an i-type amorphous silicon containing hydrogen and has a thickness of, for example, about several nm~25 nm. The second conductivity type layer 13$p$ is formed of an amorphous semiconductor doped with a dopant having a conductivity type different from that of semiconductor substrate 10. The second conductivity type layer 13$p$ of the embodiment is made of a p-type amorphous silicon containing hydrogen. The second conductivity type layer 13$p$ has a thickness of, for example, about 2 nm~50 nm. The method of forming the second i-type layer 13$i$ and the second conductivity type layer 13$p$ is identical to the method of forming the first i-type layer 12$i$ and the first conductivity type layer 12$n$ except for the type of dopant that the first conductivity type layer 12$n$ is doped with during manufacturing.

Figure 5:
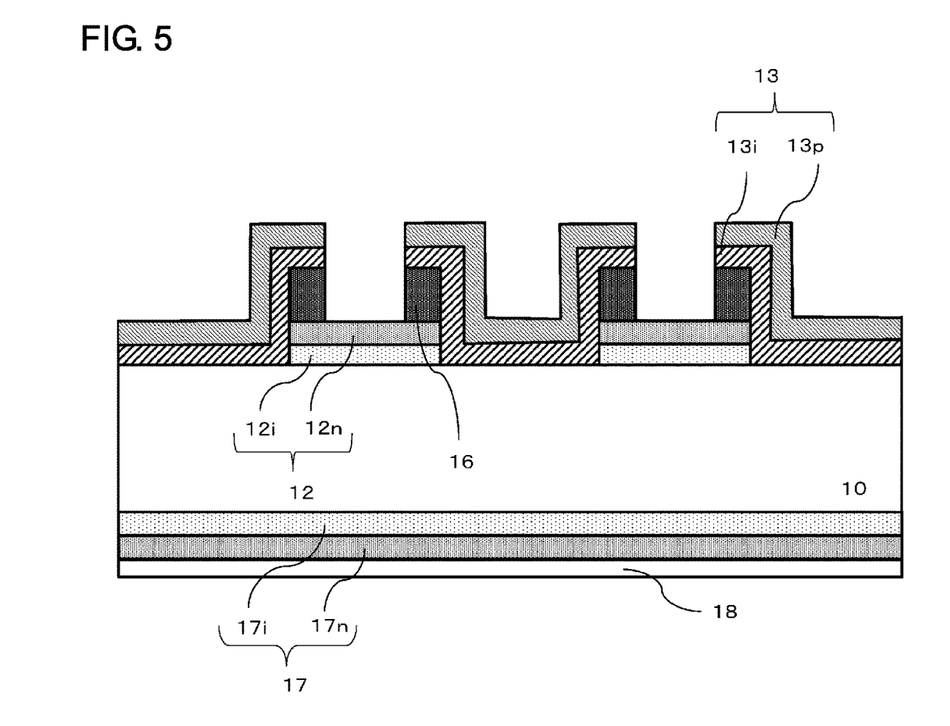
FIG. 5 is a schematic cross sectional view showing a method of manufacturing a photoelectric conversion part according to the embodiment.

Subsequently, as shown in FIG. 5, the second stack 13 is patterned to form an opening that exposes the first stack 12. The opening serves as an electric power retrieving part that will be in direct contact with the electrode when the electrode of the solar cell 70 is formed subsequently.

First, the second stack 13 is patterned by laser. In this step, too, the laser beam conditioned similarly to the case of patterning the first stack 12 may be used for patterning. More specifically, the third harmonic (wavelength: 355 nm) of Nd:YAG laser (wavelength: 1064 nm) is used as a laser light source and the target is irradiated with an intensity of about 0.1~0.5 J/cm2 per one pulse.

Subsequently, the first insulating layer 16 is etched to expose the first stack 12. The step is performed by using an acid etchant such as an aqueous solution of hydrofluoric acid so as to prevent the second stack 13 from being removed. As a result of performing this step, the first conductivity type layer 12n included in the first stack 12 is exposed.

Subsequently, a third stack 17 comprised of a third i-type layer 17i and a first conductivity type layer 17n is formed on a surface opposite to the back surface of the semiconductor substrate 10 on which the first stack 12 and the second stack 13 are formed, i.e., on the light receiving surface. The third i-type layer 17i is made of an i-type amorphous silicon containing hydrogen and has a thickness of, for example, about several nm~25 nm. A first conductivity type layer 17n is provided on the third i-type layer 17i. The first conductivity type layer 17n is formed of an amorphous semiconductor layer doped with a dopant of the same conductivity type as that of the semiconductor substrate 10. The first conductivity type layer 17n of the embodiment is formed of an n-type amorphous silicon containing hydrogen and has a thickness of, for example, about 2 nm~50 nm. The method of stacking the third i-type layer 17i and the first conductivity type layer 17n is the same as the method of forming the first i-type layer 12i and the first conductivity type layer 12n.

A second insulating layer 18 having a function of an antireflection film and a protection film is provided on the first conductivity type layer 17n. The second insulating layer 18 is formed of, for example, silicon oxide (SiO2), silicon nitride (SiN), silicon oxynitride (SiNO), or the like. The thickness of the second insulating layer 18 is set as appropriate in accordance with the antireflection property required of an antireflection film. For example, the thickness is set to about 80 nm~1000 nm.

The sequence of forming the first stack 12, the second stack 13, and the third stack 17 in the manufacturing method described so far is not particularly limited. The stacks may be formed in an arbitrary sequence so that the cross sectional structure of the photoelectric conversion part as shown in FIG. 5 results. Described above is a method of manufacturing the photoelectric conversion part.

(Method of Forming Electrode of Solar Cell 70)

A description will be given of a method of forming an electrode for retrieving electric power provided on the surface of the semiconductor substrate 10 formed with the first stack 12 and the second stack 13, i.e., on the back surface where the sunlight does not directly enter, breaking down the method into five steps.

The five steps include (S1) the first step of forming a conductive thin film layer 20 formed of a metal such as copper on the back surface of the photoelectric conversion part; (S2) the second step of providing a third insulating layer 22 formed of silicon nitride (SiN) or the like on the conductive thin film layer 20; (S3) the third step of forming a seed layer first exposed portion by removing a portion of the third insulating layer 22; (S4) the fourth step of forming a copper electrode 24 on the seed layer first exposed portion; and (S5) the step of removing the third insulating layer 22 and the conductive thin film layer 20 exposed in the opening of the copper electrode 24 and isolating the p-side electrode 15 and the n-side electrode 14.

(S1)

Figure 6:
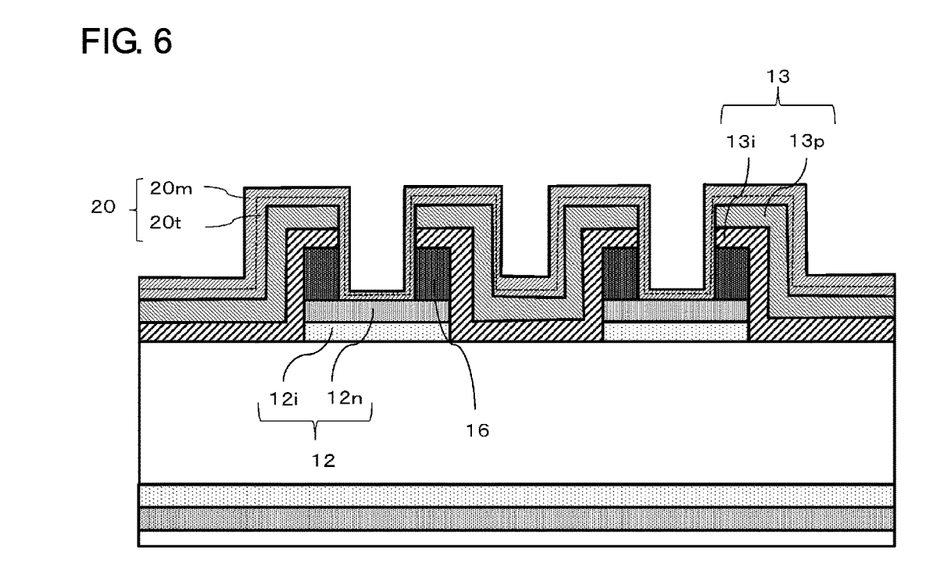
FIG. 6 is a schematic cross sectional view showing a method of manufacturing an electrode portion of the solar cell according to the embodiment.

A solar cell in which the photoelectric conversion part having the cross section of FIG. 5 is formed according to the method described above is prepared. As shown in FIG. 6, S1 is a step of forming the conductive thin film layer 20 comprised of a transparent conductive oxide layer 20t and a metal thin film layer 20m on the back surface of the photoelectric conversion part. The conductive thin film layer 20 formed in these steps is used as a plating seed layer in the electrolytic plating process performed subsequently.

The transparent conductive oxide layer 20t is formed of, for example, a transparent conductive oxide such as a tin oxide (SnO2), a zinc oxide (ZnO), an indium tin oxide (ITO), or the like. The transparent conductive oxide layer 20t according to this embodiment has a thickness of about 50 nm~100 nm. The transparent conductive oxide layer 20t is evenly formed on the back surface of the photoelectric conversion part by a thin film formation method such as sputtering and vapor deposition.

The metal thin film layer 20m is formed of a metal material such as copper (Cu), tin (Sn), gold (Au), silver (Ag), nickel (Ni), and titanium (Ti). In this embodiment, the metal thin film layer 20m made of copper (Cu) is formed. The metal thin film layer 20m is formed to have a thickness of, for example, about 50 nm~300 nm. Therefore, the thickness of the conductive thin film layer 20 formed in S1 step is about 100 nm~400 nm in total.

(S2)

Figure 7:
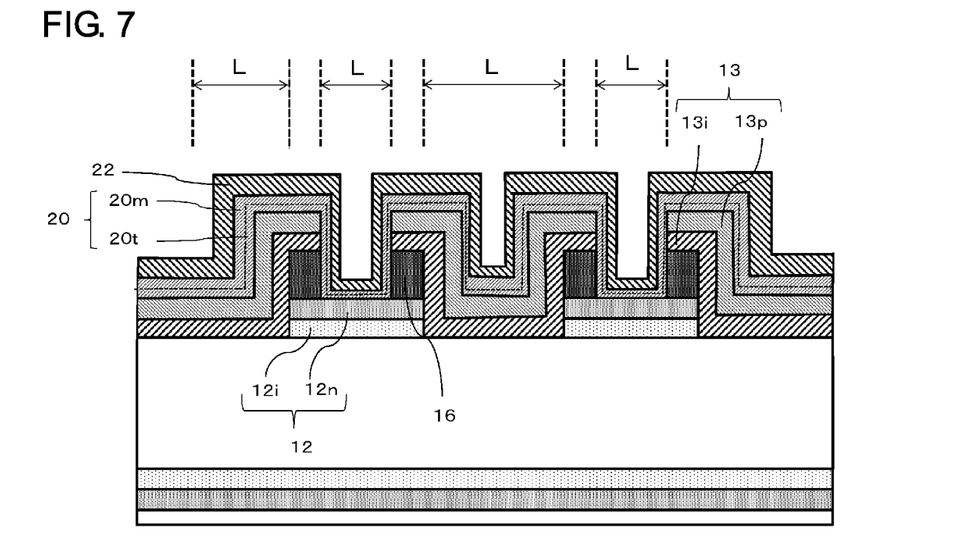
FIG. 7 is a schematic cross sectional view showing a method of manufacturing an electrode portion of the solar cell according to the embodiment.

S2 is a step to provide the third insulating layer 22 on the conductive thin film layer 20 formed in S1 step, as shown in FIG. 7. Silicon nitride (SiN), and, alternatively, of silicon oxide (SiO2), silicon oxynitride (SiON), or the like can be used to form the third insulating layer 22. Still alternatively, a resist film may be deposited as the third insulating layer 22. The third insulating layer 22 formed of silicon nitride or the like is formed in a uniform thickness of about 10~500 nm on the conductive thin film layer 20 by a thin film formation method such as sputtering or vacuum deposition. In the case of depositing a resist film, the film is formed in a thickness of about 100~5000 nm. In this embodiment, the third insulating layer 22 made of silicon nitride (SiN) and having a thickness of about 100 nm is formed.

(S3)

Figure 8:
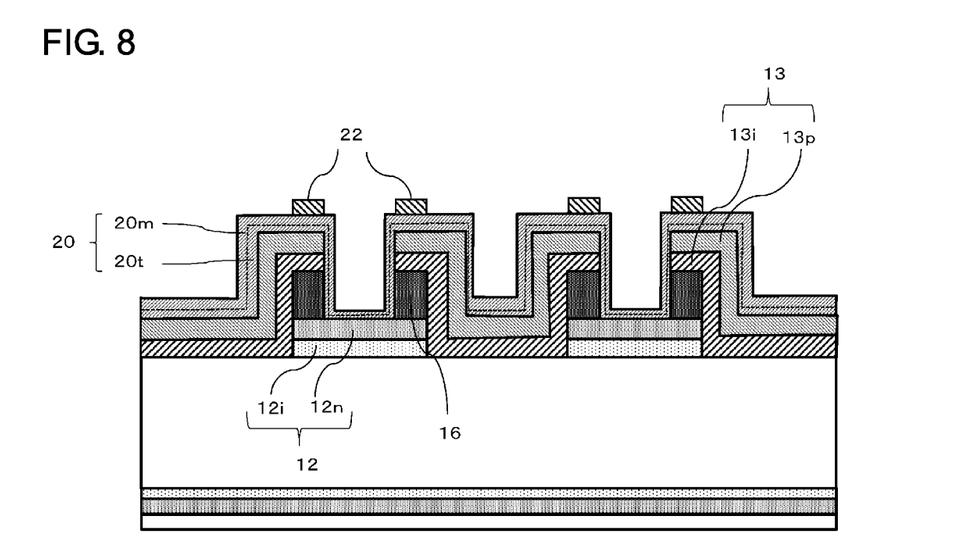
FIG. 8 is a schematic cross sectional view showing a method of manufacturing an electrode portion of the solar cell according to the embodiment.

S3 is a step of patterning the third insulating layer 22 formed in S2 to remove a part thereof so as to form a conductive thin film layer exposed portion, as shown in FIG. 8. In this embodiment, the third insulating layer 22 formed in S2 is irradiated by laser and a conductive thin film layer exposed portion having a width smaller than a scheduled width of the finger electrode is formed in an area where the finger electrode is scheduled to be formed in the subsequent step. In this process, the laser beam is radiated with an intensity capable of removing only the third insulating layer 22 so that the conductive thin film layer 20 remains in the portion irradiated by laser. Specifically, YAG laser or eximer laser can be used. In this embodiment, the third harmonic (wavelength: 355 nm) of Nd:YAG laser (wavelength: 1064 nm) is used as a laser light source and the target is irradiated with an intensity of about 0.1~0.5 J/cm2 per one pulse.

In this embodiment, the third insulating layer 22 is patterned by laser scan so that the third insulating layer 22 formed of silicon nitride (SiN) remains in a width of about 100 μm in a front view corresponding to FIG. 8. The area where the conductive thin film layer 20 is exposed is defined as a conductive thin film layer exposed portion of the embodiment.

(S4)

S4 is a step of forming the copper electrode 24 in the conductive thin film layer exposed portion formed in S3. In this embodiment, the copper electrode 24 comprised of a copper plating film of a thickness of about 10~30 μm is formed by electrolytic plating on the plating seed layer comprised of the conductive thin film layer 20 of a two-layer structure including the transparent conductive oxide layer 20t and the metal thin film layer 20m.

Figure 9:
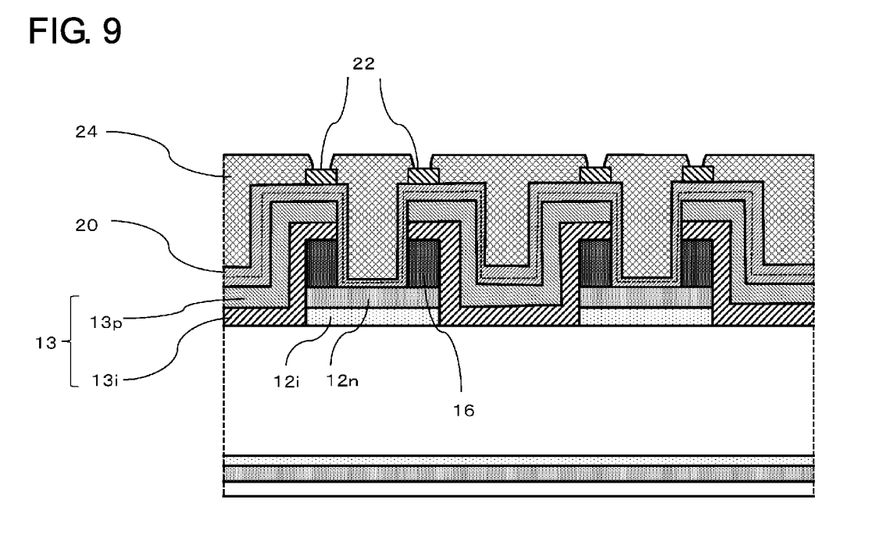
FIG. 9 is a schematic cross sectional view showing a method of manufacturing an electrode portion of the solar cell according to the embodiment.

It should be noted here that the thickness of the third insulating layer 22 formed of silicon nitride (SiN) is about 100 nm and the copper electrode 24 is formed to be thicker than the third insulating layer 22 formed in S2. It is common in an electrolytic plating step that, when the thickness of the plating film exceeds the thickness of a wall formed of an insulating film, the plating film not only expands in the height direction (z direction in the figure) but also expands in the horizontal direction (y direction). Thus, in the case of the embodiment, the end of the third insulating layer 22 invades into the copper electrode 24 so that the cross section occurring when the formation of the copper electrode 24 is completed is as shown in FIG. 9. Of the third insulating layer 22 that remains in a width of 100 μm, for example, an area of about 30 μm from the ends is then covered by the copper electrode 24. The copper electrode 24 formed in this way serves as the finger electrode of the back surface junction type solar cell.

(S5)

S4 is an electrode removal step of electrically isolating adjacent copper electrodes 24 formed in S4 to form the p-side electrode 15 and the n-side electrode 14. The solar cell 70 undergoing the process as far as step S4 and presenting the cross sectional structure shown in FIG. 9 is irradiated by laser. For example, laser irradiation may be in a range indicated by L in FIG. 10. The laser beam is configured to be of an intensity capable of removing only the third insulating layer 22. Laser energy is easily absorbed by copper. Therefore, a portion of the third insulating layer 22 covered by the copper electrode 24 is not removed, and only a portion of the third insulating layer 22 not covered by the copper electrode 24 is removed. In other words, the copper electrode 24 itself serves as a mask to remove the third insulating layer 22 using a laser beam. The third insulating layer 22 is removed so as to be flush with the end of the copper electrode 24. The condition of using laser in this step may be identical to the condition of using laser in (S3) step.

Subsequently, the conductive thin film layer 20 exposed in the opening of the third insulating layer 22 is removed so as to isolate adjacent copper electrodes 24 electrically. For isolation between copper electrodes 24, chemical etching using an etchant such as sulfuric acid hydrogen peroxide mixture solution (mixed aqueous solution of sulfuric acid aqueous solution and hydrogen peroxide solution), hydrochloric acid and hydrogen peroxide solution (mixed aqueous solution of hydrogen chloride aqueous solution and hydrogen peroxide solution), or the like is applied. In this embodiment, a chemical etchant is used to form a channel in the conductive thin film layer 20. Alternatively, laser may be used to form a channel. In this process, the laser output is changed to a level capable of removing the conductive thin film layer 20 to form a channel. In this way, adjacent copper electrodes 24 are electrically isolated to produce the p-side electrode 15 and the n-side electrode 14. In this process, the width of the channel formed for electrode isolation may be about 50 μm. In other words, the width of the gap between the p-side electrode 15 and the n-side electrode 14 can be about 50 μm.

The position and width of laser irradiation may be as shown in FIG. 11. In other words, the position indicated by L in FIG. 11 may be irradiated by laser to form two channels simultaneously. In this case, the work time is reduced as compared with the case of forming channels one by one and the electrodes can be separated by a gap of a small width.

Advantage of the Embodiment

By employing the manufacturing method of the embodiment, the p-side electrode and the n-side electrode can be isolated by forming a channel of a small width without using an etching paste or photoresist. In this way, a channel of a width smaller than the width of laser irradiation can be formed. The minimum value of the width of a channel that can be formed by laser processing is dependent on the device for laser oscillation. Reduction in the minimum size of the width of a channel requires an expensive device. According to this embodiment, a channel of a small width can be formed by using a laser device regardless of the minimum value of the width of a channel. Further, since the p-side electrode 15 and the n-side electrode 14 can be isolated by working a channel having a narrower width than the related art, the filling rate of the p-side electrode 15 and the n-side electrode 14 on the solar cell surface can be improved so that, given the same area, a larger number of electrodes can be formed on the solar cell surface. To describe it in further details, the conductive thin film layer 20 covered by the third insulating layer 22 is not removed by laser irradiation or chemical etching. Therefore, the areas of the p-side electrode 15 and the n-side electrode 14 that collect carriers during photoelectric conversion is enlarged. Consequently, the efficiency of collecting carriers generated during phot conversion can be increased and the property of the solar cell can be improved.

(Application of Solar Cell to Bus Bar Part)

Figure 12:
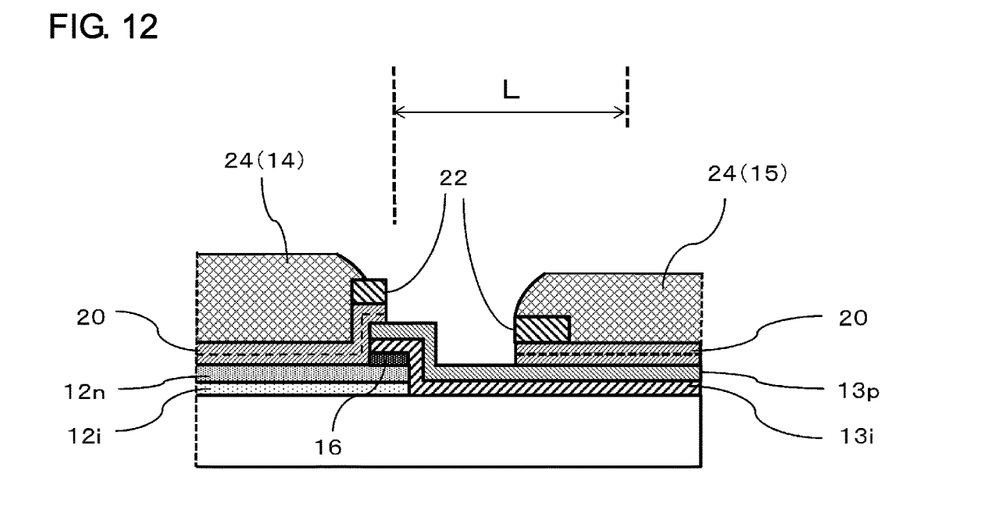
FIG. 12 is a B-B cross sectional view of FIG. 1.

The detailed description of the manufacturing method above relates to the finger electrode portions of the electrodes of a back surface junction type solar cell. However, the method can of course be applied to isolation of the end of the finger of the n-side electrode 14 and the bus bar part of the p-side electrode 15. FIG. 12 shows a B-B cross sectional view of FIG. 1.

As shown in FIG. 12, the electrodes are isolated such that the third insulating layer 22 formed of SiN and the conductive thin film layer 20 comprised of the transparent conductive oxide layer 20t and the metal thin film layer 20m remain at the end of the finger electrode of the n-side electrode 14. In this process, the end of the copper electrode 24 formed in the bus bar part of the p-side electrode 15 is used as a mask for electrode isolation. Laser is radiated such that the bus bar part of the p-side electrode 15 is irradiated by laser but the finger electrode of the n-side electrode 14 is not irradiated by laser. In other words, the range of laser irradiation is bounded by a position defined by L in FIG. 12. The conductive thin film layer 20 not covered by the n-side electrode 14 and the third insulating layer 22 can collect carriers generated in the photoelectric conversion part in the n-side electrode 14 via the conductive thin film layer 20 that is highly conductive. For this reason, the efficiency of collecting carriers generated in an area neighboring the conductive thin film layer 20 is increased and the property of the solar cell is improved, by securing a large area of the conductive thin film layer 20.

The present invention has been described with reference to the embodiment but the invention is not limited to the embodiment described. Modifications can be made to the extent that they do not depart from the intent of the invention. For example, in (S1), the transparent conductive oxide layer 20t and the metal thin film layer 20m are built on one another to form the conductive thin film layer 20, but the conductive thin film layer 20 is comprised solely of the transparent conductive oxide layer 20t. In (S5) of the embodiment, the third insulating layer 22 invading into an area beneath the copper electrode 24 is not removed, but the third insulating layer 22 may be removed by wet etching, etc.

While the foregoing has described what are considered to be the best mode and/or other examples, it is understood that various modifications may be made therein and that the subject matter disclosed herein may be implemented in various forms and examples, and that they may be applied in numerous applications, only some of which have been described herein. It is intended by the following claims to claim any and all modifications and variations that fall within the true scope of the present teachings.

What is claimed is:

1. A method of manufacturing a solar cell, comprising:
   forming a conductive thin film layer on a semiconductor substrate, wherein the conductive thin film layer includes at least one of a metal thin film layer and a transparent conductive oxide film layer;
   forming an insulating film on a part of the conductive thin film layer;
   forming a plating film on the conductive thin film layer in an area not overlapping the insulating film and on a part of the insulating film; and
   removing the insulating film in an area not overlapping the plating film.

2. The method of manufacturing a solar cell according to claim 1, wherein laser is used in the removing of the insulating film.

3. The method of manufacturing a solar cell according to claim 2, wherein the laser is simultaneously irradiated to the insulating film in an region not overlapping the plating film and to the plating film in an region overlapping the insulating film.

4. The method of manufacturing a solar cell according to claim 1, wherein wet etching is used in the removing of the insulating film.

5. The method of manufacturing a solar cell according to claim 1, wherein the semiconductor substrate includes a photoelectric conversion layer formed of amorphous silicon containing hydrogen.

6. The method of manufacturing a solar cell according to claim 1, further comprising;
   removing the conductive thin film layer in an area not overlapping the plating film.

7. The method of manufacturing a solar cell according to claim 6, wherein laser is used in the removing of the conductive thin film layer.

8. The method of manufacturing a solar cell according to claim 1, wherein a thickness of the plating film is larger than a thickness of the insulating film.

* * * * *